United States Patent [19]

Jeng

[11] Patent Number: 5,661,072
[45] Date of Patent: Aug. 26, 1997

[54] METHOD FOR REDUCING OXIDE THINNING DURING THE FORMATION OF A SEMICONDUCTOR DEVICE

[75] Inventor: Nanseng Jeng, Boise, Id.

[73] Assignee: Micron Technology, Inc., Boise, Id.

[21] Appl. No.: 652,064

[22] Filed: May 23, 1996

[51] Int. Cl.⁶ .................................................. H01L 21/76
[52] U.S. Cl. ..................... 438/439; 438/762; 438/770; 438/981
[58] Field of Search .............................. 437/69, 70, 72, 437/40 GS, 41 GS

[56] References Cited

U.S. PATENT DOCUMENTS

| | | | |
|---|---|---|---|
| 4,764,248 | 8/1988 | Bhattacherjee et al. | 156/643 |
| 5,429,982 | 7/1995 | Chao | 437/69 |
| 5,438,016 | 8/1995 | Figura et al. | 437/67 |
| 5,472,904 | 12/1995 | Figura et al. | 437/67 |
| 5,492,853 | 2/1996 | Jeng et al. | 437/60 |
| 5,543,343 | 8/1996 | Bryant et al. | 437/69 |

FOREIGN PATENT DOCUMENTS

| | | | |
|---|---|---|---|
| 0336515 | 10/1989 | European Pat. Off. | 437/69 |
| 0133846 | 10/1981 | Japan | 437/69 |
| 0023444 | 5/1987 | Japan | 437/69 |

OTHER PUBLICATIONS

"Oxynitride Pad Locos (ON–LOCOS) Isolation Technology For Gigabit Drams" Extended Abstracts of the 1995 International Conference on Solid State Devices and Materials, Osaka, 1995, pp. 139–141.

*Primary Examiner*—Trung Dang

[57] ABSTRACT

A method of forming a semiconductor device comprises the steps of forming a patterned pad oxide layer having a first nitrogen concentration over a semiconductor substrate assembly such as a semiconductor substrate. The substrate is oxidized to form field oxide which also forms an area of Kooi nitride at the interface of the field oxide and the active area. The Kooi nitride comprises a second nitrogen concentration which is less than the nitrogen concentration of the pad oxide. Next, the pad oxide and the Kooi nitride are oxidized thereby forming gate oxide over the pad oxide. The nitridized pad oxide oxidizes slower than the Kooi nitride, and therefore gate oxide thinning which is known to result from Kooi nitride is reduced or eliminated. Further, the need for the growth of a sacrificial oxide layer to remove the Kooi nitride, and a subsequent strip of the sacrificial oxide is eliminated thereby reducing thinning of the field oxide.

20 Claims, 1 Drawing Sheet

METHOD FOR REDUCING OXIDE THINNING DURING THE FORMATION OF A SEMICONDUCTOR DEVICE

FIELD OF THE INVENTION

This invention relates to the field of semiconductor manufacture, and more particularly to a method for forming isolation layers such as field oxide and gate oxide.

BACKGROUND OF THE INVENTION

During the formation of semiconductor devices such as memory devices and microprocessors various layers are formed over a substrate assembly. The substrate assembly can comprise a wafer or wafer section of silicon, gallium arsenide, or other semiconductor, or a semiconductor layer having one or more layers of material formed thereover.

One method for forming a semiconductor devices comprises forming a blanket pad oxide layer over a semiconductor substrate assembly, then forming a blanket nitride layer over the pad oxide layer. The pad oxide and nitride layers are then patterned to expose the substrate assembly. Subsequently, the exposed substrate assembly is oxidized to form a thick oxide layer such as a field oxide and the nitride and pad oxide are stripped. A sacrificial oxide layer is grown over the substrate assembly surface and then stripped. Finally, a thin oxide such as gate oxide is grown over the substrate assembly surface.

During the formation of the field oxide, a nitride region is known to form along the boundary of the field oxide and the substrate assembly (such as the semiconductor substrate). Due to the increased concentration of nitrogen around this region, commonly referred to as "Kooi nitride" or "Kooi ribbon," oxidation is slowed and thinning of any subsequently formed oxide such as gate oxide can result. Gate oxide thinning normally occurs along the interface of the field oxide and the active area. Forming the sacrificial oxide after stripping the pad oxide oxidizes this Kooi nitride and allows for a more uniform oxide layer to form after oxidizing the Kooi nitride.

A process such as that described above can result in undesirable thinning of the field oxide, as shown by the following sample process. During oxidation of the substrate assembly to form a field oxide layer 3000 Å thick, the patterned nitride also slightly oxidizes or forms a "nitride cap." This oxynitride over the nitride must be removed which also removes part of the field oxide, for example 350 Å thereby resulting in a 2650 Å field oxide. The patterned nitride is then removed, for example with $H_3PO_4$, which removes the nitride much faster than it removes oxide but a portion of the field oxide is also removed, for example 50 Å to result in a 2600 Å layer of field oxide. The pad oxide must be removed after the nitride strip which again removes a portion of the field oxide, for example 250 Å to result in a 2350 Å layer.

During the growth of a 300 Å sacrificial oxide layer, some thickness is added to the field oxide, for example 100 Å to result in a 2450 Å field oxide, but the added growth is less than the thickness of the sacrificial oxide. The 300 Å sacrificial oxide is then stripped and an overetch is typically included thereby resulting in a 2000 Å field oxide layer. Finally, a gate oxide layer, for example 100 Å is grown which adds, for example, 50 Å to the field oxide thereby resulting in a 2050 Å layer of field oxide.

Thinning the field oxide is undesirable as is known in the art. This is especially true as the distance between transistor gates decreases with improved manufacturing technology because growing a sufficiently thick field oxide between the gates becomes more difficult. A process which reduces thinning of the field oxide would be desirable.

SUMMARY OF THE INVENTION

The present invention provides a new method for reducing problems associated with gate oxide thinning, Kooi nitride, and reduction of field oxide thickness, and can decrease the number of steps required with conventional processes. In accordance with one embodiment of the present invention, a patterned pad oxide layer is formed over a semiconductor substrate assembly, the pad oxide having a concentration of nitrogen. Field oxide is formed which is known to form a region of Kooi nitride typically at the interface of the field oxide and the substrate assembly. In a particularly preferred embodiment, a nitrogen concentration of the Kooi nitride is less than the nitrogen concentration of the pad oxide. Next, the pad oxide layer is oxidized along with the Kooi nitride thereby forming gate oxide over the pad oxide layer.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention. Which can be determined by one of skill in the art by examination of the information herein.

DETAILED DESCRIPTION OF THE PREFERRED EMBODIMENTS

Figure 1:
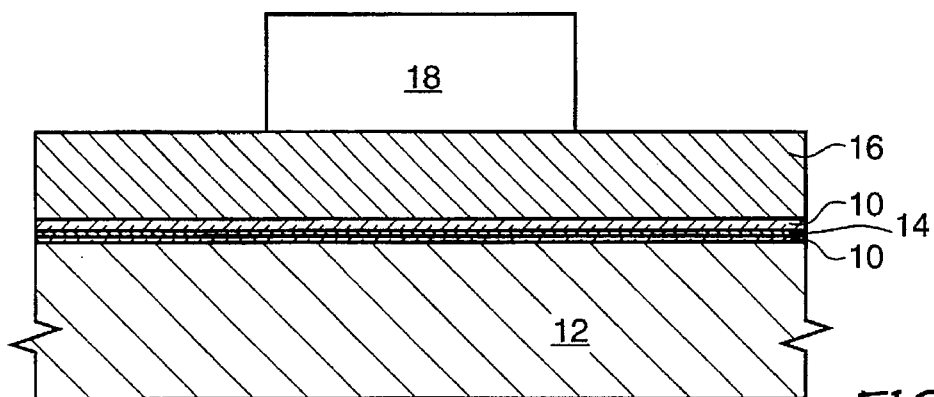
FIG. 1 depicts an exemplary in-process wafer assembly having various layers and a patterned material formed thereon, illustrated in vertical section.

One embodiment of an inventive process for forming a semiconductor device is shown in FIGS. 1–4. As shown in FIG. 1 a first oxide layer such as a pad oxide 10 is formed over a semiconductor substrate assembly such as a semiconductor wafer 12. The substrate assembly can also comprise various other layers of material over which an oxide layer is to be formed rather than the semiconductor wafer shown. The pad oxide 10 is formed such that it comprises a first concentration of nitrogen 14, for example in the range of about 5% to about 20% of nitrogen (comparing the number of nitrogen atoms to the number of oxygen atoms) although other concentrations may function sufficiently as well. Nitrogen 14 is formed within oxide layer 10 in the region of silicon 12. Although shown as three distinct layers, the nitrogen 14 comprises a concentration gradient within the oxide layer 10, and layers 10 and 14 are preferably formed as a single layer. Forming this nitrogen-rich pad oxide, that is a pad oxide which comprises at least a portion having a nitrogen concentration of at least 5%, can be accomplished with any nitridation technique, such as by using NO or $N_2O$ oxidation in a furnace or by using rapid thermal nitridation. An example of forming this pad oxide is to oxidize the semiconductor substrate in an oxidizing ambient with $N_2O$ gas at a temperature of about 950° C. for between about 90 minutes and 150 minutes. The resulting nitrogen-rich pad oxide has a thickness of about 130 Å.

Figure 2:
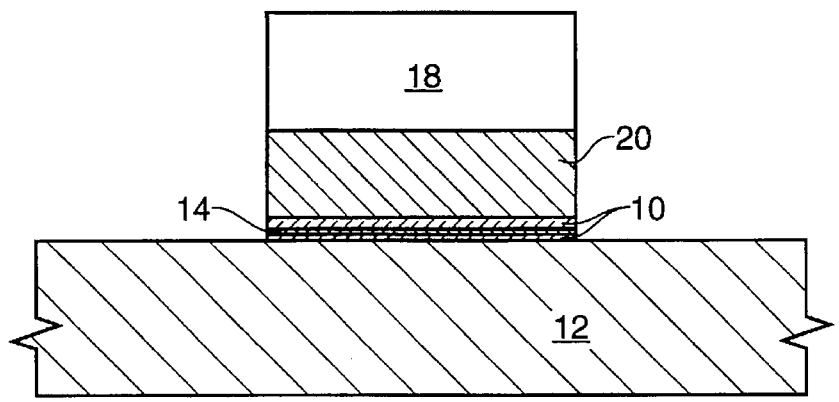
FIG. 2 depicts in vertical section the structure of FIG. 1 after an etch.

Next, the pad oxide 10 is patterned, for example using the process shown in FIG. 1 wherein a blanket nitride layer 16 is formed over the blanket pad oxide 10, then a patterned photoresist layer 18 is formed over the nitride 16 and pad oxide 10. As shown in FIG. 2, the nitride 20 and pad oxide 10, 14 are patterned which exposes the substrate assembly in field regions. The nitrogen-rich pad oxide which has been etched can be removed either during patterning of the nitride 20 using a plasma dry etch, or the pad oxide can also be removed after patterning the nitride using a separate etch such as a wet etch with HF.

Figure 3:
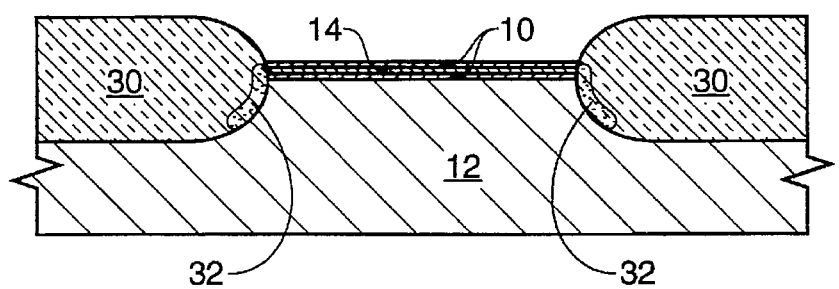
FIG. 3 is a cross section of the FIG. 2 structure after removal of various layers and formation of a thick oxide layer.

The photoresist 18 is removed and the substrate assembly is oxidized to form a thick oxide region such as field oxide 30 as shown in FIG. 3. Many processes for forming layers of oxide and field oxide are known in the art. A sample process to form field oxidation is to heat the exposed silicon to a temperature of between about 900° C. and about 1100° C. in the presence of hydrogen and oxygen for about 90 minutes to grow a layer of field oxide about 4,000 Å thick. Many other processes are known in the art which would function equally well. Forming the field oxide results in regions of nitride 32, commonly referred to as "Kooi nitride," at the interface of the substrate assembly 12 and the field oxide 30. The Kooi nitride comprises a second nitrogen concentration. It is preferable that the first nitrogen concentration of the pad oxide, which is controllable, is equal to or greater than the second concentration of the Kooi nitride, which is less controllable. Forming a pad oxide with a nitride concentration greater than the Kooi nitride results in the Kooi nitride oxidizing at a faster rate than the oxidation of the pad oxide.

After the field oxide 30 is formed, the nitride layer 20 is removed along with any oxynitride cap (not shown) which forms over the nitride layer 20 during field oxidation. As a sample process, the oxynitride cap can be removed using a wet or dry oxide etch. The remaining nitride can be stripped using phosphoric acid with water at a temperature of about 150° C. for about 100 minutes to remove a 2200 Å to 2400 Å nitride layer. This nitride layer can also be removed in a dry system such as in a plasma chamber. A portion of the pad oxide 10, 14 may also be removed after removal of the nitride layer 20, but at least a portion of the pad oxide comprising the nitrogen 14 should remain.

Figure 4:
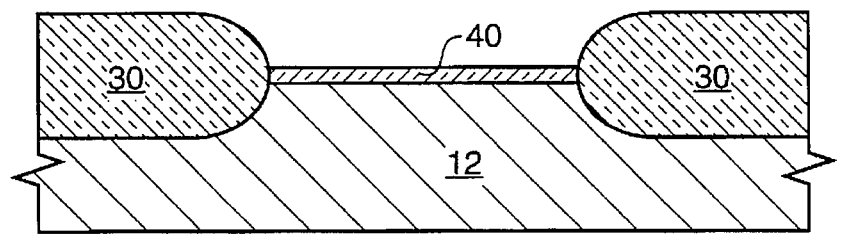
FIG. 4 shows the FIG. 3 embodiment after formation of gate oxide.

The nitridized pad oxide 10, 14 and the Kooi nitride are then oxidized, for example to form gate oxide 40 as shown in FIG. 4. As a sample process, the gate oxide can be grown using an initial-dry oxidation (O2); a Trans-LC oxidation; a wet oxidation with Trans-LC (O2/H2); and a final dry oxidation. Since the pad oxide comprises a nitrogen concentration which is equal to or greater than the nitrogen concentration of the Kooi nitride, and the Kooi nitride is oxidized at least as fast as the pad oxide (if the nitrogen concentrations of the pad oxide and the Kooi nitride are about equal) or the Kooi nitride can be oxidized faster than the nitridized pad oxide (if the nitrogen concentration if the pad oxide is somewhat greater than the nitrogen concentration of the Kooi nitride). Under these conditions the gate oxide thickness can be more uniform as thinning at the interface of the field oxide and the active area is reduced or eliminated.

This process therefore eliminates the requirement for forming a sacrificial oxide layer to remove the Kooi nitride. The sacrificial oxide strip required with conventional processes, which is known to decrease the thickness of the field oxide, can therefore be omitted thereby also reducing the number of steps required to form a semiconductor device.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the nitridized pad oxide layer can be formed as a single layer having a uniform nitrogen concentration, or the pad oxide can be two or more layers, for example a nitrogen-rich oxide layer interposed between two oxide layers having a lesser nitrogen concentration or essentially no nitrogen. It is therefore contemplated that the appended claims will cover any such modifications or embodiments as fall within the true scope of the invention.

What is claimed is:

1. A method for forming a semiconductor device comprising the following steps:
    forming a patterned first oxide layer over a semiconductor substrate assembly, said first oxide layer having a first nitrogen concentration;
    forming an area of Kooi nitride, said Kooi nitride having a second nitrogen concentration;
    oxidizing said first oxide layer and said Kooi nitride.

2. The method of claim 1 wherein said first oxide and said Kooi nitride are oxidized during a single oxidizing step.

3. The method of claim 2 wherein said first nitrogen concentration is greater than said second nitrogen concentration.

4. The method of claim 2 wherein said Kooi nitride oxidizes faster than said first oxide layer.

5. The method of claim 1 wherein said Kooi nitride is formed during a step of oxidizing said substrate assembly.

6. The method of claim 1 wherein said first oxide layer and said Kooi nitride are oxidized during a single oxidation step which forms gate oxide.

7. The method of claim 1 wherein said first concentration is between about 5% and about 20%.

8. A method of forming a semiconductor device comprising the following steps:
    forming a blanket first oxide layer over a semiconductor substrate assembly, said first oxide having at least a portion comprising a nitrogen-rich oxide layer;
    forming a blanket nitride layer over said first oxide layer;
    patterning said nitride layer and said first oxide layer;
    oxidizing said substrate assembly which is uncovered by said nitride layer to form a second oxide layer;
    removing said nitride layer and leaving at least a portion of said nitrogen-rich oxide layer;
    forming a third oxide layer over said nitrogen-rich oxide layer.

9. The method of claim 8 wherein said first oxide layer is pad oxide, said second oxide layer is field oxide, and said third oxide layer is gate oxide.

10. The method of claim 9 wherein said nitrogen-rich oxide layer has a first nitrogen concentration, further comprising the step of forming an area of Kooi nitride prior to forming said gate oxide, said Kooi nitride having a second nitrogen concentration which is less than said first nitrogen concentration.

11. The method of claim 10 wherein said Kooi nitride is formed during said step of oxidizing said substrate assembly.

12. The method of claim 10 wherein during said step of forming said gate oxide, said nitrogen-rich oxide layer oxidizes at a slower rate than said Kooi nitride.

13. The method of claim 8 wherein said nitrogen-rich oxide layer comprises between about 5% and 20% nitrogen.

14. A method of forming a semiconductor device comprising the following steps:

forming a patterned pad oxide layer over a semiconductor substrate assembly, said pad oxide having a first nitrogen concentration;

oxidizing said substrate assembly to form field oxide and forming a nitridized area having a second nitride concentration;

oxidizing said pad oxide layer and said nitridized area thereby forming gate oxide over said pad oxide layer.

15. The method of claim 14 further comprising the step of removing a portion of said pad oxide subsequent to forming said field oxide thereby thinning said pad oxide layer.

16. The method of claim 14 wherein said semiconductor substrate assembly is a semiconductor wafer, and said thinned pad oxide and said gate oxide separate a transistor gate from said wafer.

17. The method of claim 14 wherein stud pad oxide is formed using rapid thermal nitridation.

18. The method of claim 14 the pad oxide is formed using a gas comprising nitrogen.

19. The method of claim 15 wherein said pad oxide layer and said nitridized area are oxidized during a single oxidation step.

20. The method of claim 14 wherein said first nitrogen concentration is between about 5% and 20%.

* * * * *

UNITED STATES PATENT AND TRADEMARK OFFICE
CERTIFICATE OF CORRECTION

PATENT NO.  : 5,661,072
DATED       : August 26, 1997
INVENTOR(S) : Jeng

It is certified that error appears in the above-indentified patent and that said Letters Patent is hereby corrected as shown below:

Column 2, line 43, please replace ".  Which" with -- which --.

Column 6, line 11, please delete "stud" and replace with -- said --.

Signed and Sealed this

Eleventh Day of November, 1997

Attest:

BRUCE LEHMAN

Attesting Officer       Commissioner of Patents and Trademarks